(12) United States Patent
Massa et al.

(10) Patent No.: US 6,818,925 B2
(45) Date of Patent: Nov. 16, 2004

(54) SEMICONDUCTOR SUBSTRATES AND STRUCTURES

(75) Inventors: John Stephen Massa, Ipswich (GB); Adrian John Taylor, Woodbridge (GB); Rodney Hollands Moss, Felixstowe (GB)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/423,149

(22) Filed: Apr. 25, 2003

(65) Prior Publication Data

US 2003/0205716 A1 Nov. 6, 2003

(30) Foreign Application Priority Data

May 2, 2002 (EP) ................................. 2253129

(51) Int. Cl.[7] .............................................. H01L 33/00
(52) U.S. Cl. ........................ 257/94; 257/194; 257/189
(58) Field of Search ........................ 257/94, 199, 200, 257/95, 190, 189, 194

(56) References Cited

U.S. PATENT DOCUMENTS

| | | | |
|---|---|---|---|
| 4,801,993 A | * | 1/1989 | Ankri et al. .................. 372/50 |
| 4,914,059 A | | 4/1990 | Nissim et al. ............... 437/235 |
| 5,719,891 A | | 2/1998 | Jewell .......................... 372/45 |
| 5,747,366 A | * | 5/1998 | Brillouet et al. .............. 438/44 |
| 5,945,690 A | | 8/1999 | Saito et al. ................... 257/94 |
| 6,392,257 B1 | * | 5/2002 | Ramdani et al. ............ 257/190 |

FOREIGN PATENT DOCUMENTS

| | | |
|---|---|---|
| EP | 0814549 A2 | 12/1997 |
| EP | 1083642 A2 | 3/2001 |

* cited by examiner

*Primary Examiner*—Long Pham
*Assistant Examiner*—(Vikki) Hoa B. Trinh

(57) ABSTRACT

An oxide layer on an indium phosphide semiconductor substrate is doped with silicon. This enables epitaxial layers to be deposited upon the substrate in a conventional manner, including mesa etching and overgrowth, to form a semiconductor structure. The doped oxide layer is thought to reduce diffusion of phosphorus out of the substrate and thus to reduce the zinc levels in the active region of the structure. Additionally, or as an alternative, after mesa etching oxide can be formed on the mesa sides and then doped with silicon. Conventional blocking layers can then be formed over the doped oxide, reducing the diffusion of zinc from the blocking layers into the rest of the structure.

7 Claims, 7 Drawing Sheets

SEMICONDUCTOR SUBSTRATES AND STRUCTURES

BACKGROUND OF THE INVENTION

1. Field of the Invention

This invention relates to the field of substrates used in the manufacture of semiconductor devices and methods used in the processing of such substrates.

2. Brief Description of Related Developments

Telecommunications equipment, and in particular equipment for optical communication networks, have had significant performance increases due to the use of III–V semiconductor materials such as indium, phosphorus, gallium and arsenic. As the performance of devices and systems based upon III–V devices increases, new mechanisms that interfere with the operation of the devices are identified. It is the object of the present invention to reduce the deleterious effect of one such mechanism within indium phosphide (InP) devices.

SUMMARY OF THE INVENTION

According to a first aspect of the invention there is provided a semiconductor device comprising a substrate of III–V semiconductor material, an oxide layer permanently formed on a surface of the substrate, the oxide layer having a significant concentration of a dopant material, and a plurality of epitaxial semiconductor layers formed on the oxide layer, wherein the oxide layer prevents diffusion from the substrate into the plurality of epitaxial semiconductor layers.

The III–V semiconductor material may be indium phosphide and it may be doped. The III–V semiconductor material may be doped with an n-type dopant. The dopant material deposited on the oxide layer may be silicon.

The plurality of epitaxial semiconductor layers may comprise a first cladding layer formed upon the substrate, an active region formed upon the first cladding layer, and a second cladding layer formed upon the active region.

According to a second aspect of the invention there is provided a method of manufacturing a semiconductor device, the method comprising the steps of: heating a substrate comprising a layer of a III–V semiconductor material to desorb a first oxide layer previously formed on a surface of the substrate, depositing dopant material on the desorbed surface of the semiconductor substrate, oxidizing the semiconductor substrate to form a further oxide layer comprising a significant concentration of the dopant material, and depositing a plurality of epitaxial layers of semiconductor material on the substrate.

The method may further include step of depositing a first cladding layer on the substrate, depositing an active region on the first cladding layer, and depositing a second cladding layer on the active region.

The method may comprise the additional step of etching one or more of the plurality of epitaxial layers of semiconductor material to form a mesa. Furthermore, the method may include the step of depositing one or more blocking layers of semiconductor material on the sides of the mesa.

The dopant material may be selectively deposited on the surface of the semiconductor substrate. Alternatively, the oxide layer comprising a significant concentration, of dopant material may be selectively etched from the surface of the semiconductor substrate. The dopant material may be silicon and it may be deposited by flowing a gas over the semiconductor substrate. The semiconductor substrate may be oxidized by exposing the semiconductor substrate to an oxidizing agent.

The method may also comprise the steps of depositing dopant material on each side of the mesa, oxidizing each side of the mesa to form oxide layers comprising a significant concentration of dopant material, and depositing one or more blocking layers of semiconductor material on the oxide layers.

The method may comprise the further step of: depositing one or more further epitaxial layers of semiconductor material on the previously deposited plurality of epitaxial layers and the uppermost blocking layer.

BRIEF DESCRIPTION OF THE DRAWINGS

The invention will now be described, by way of example only, with reference to the following Figures in which.

DETAILED DESCRIPTION OF THE PREFERRED EMBODIMENT(S)

Figure 1:
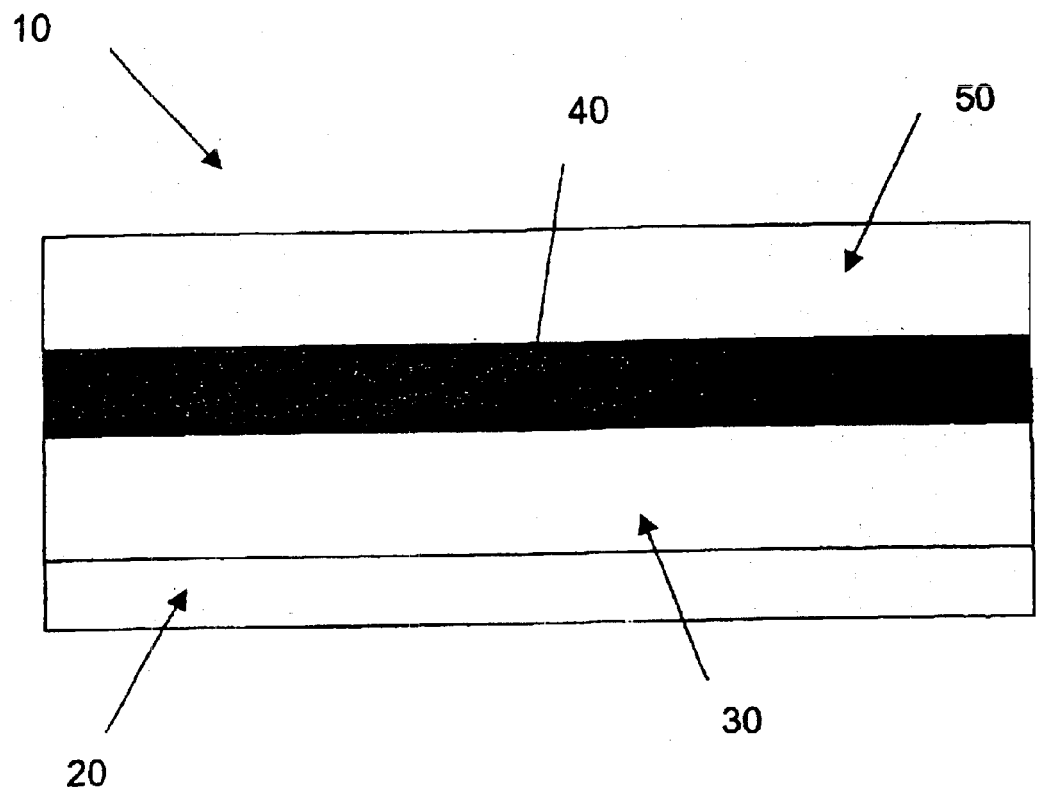
FIG. 1 shows a schematic depiction of an example of a known semiconductor structure.

FIG. 1 shows an example of a known semiconductor structure 10 that comprises an indium phosphide (InP) substrate 20 that has an n-type dopant, a first InP cladding layer 30 that has an n-type dopant, an undoped indium gallium arsenide phosphide (InGaAsP) active layer 40 and a second InP cladding layer 50 that has a p-type dopant. Such a structure may be used to manufacture a semiconductor device such as, for example, a buried heterostructure semiconductor laser.

Figure 2:
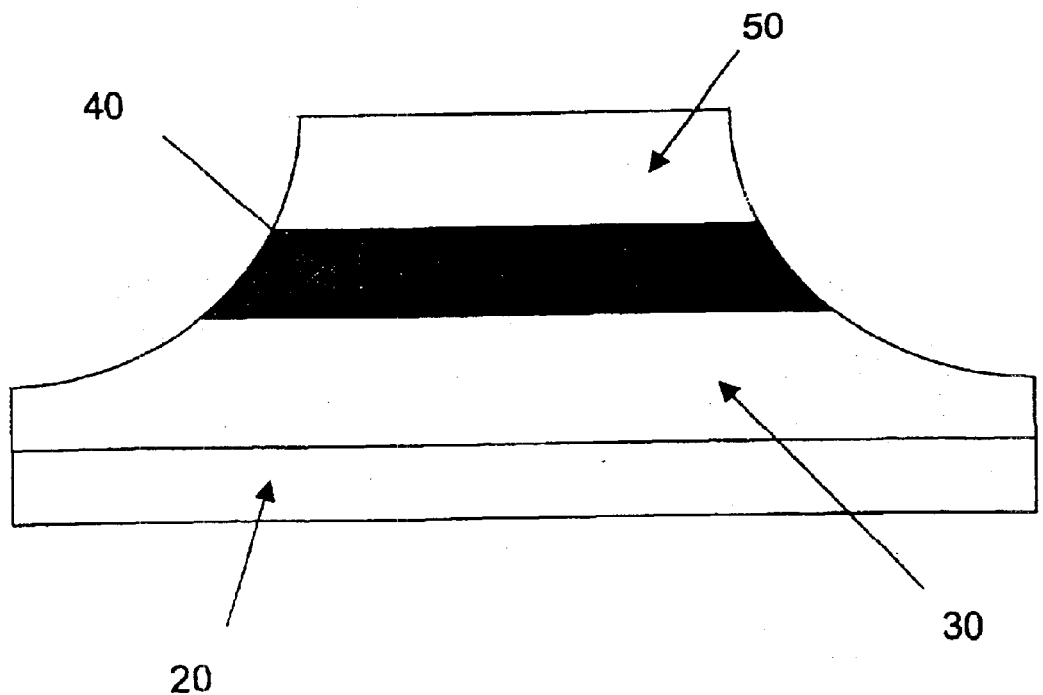
FIG. 2 shows a schematic depiction of the semiconductor structure of FIG. 1 after an etching process.
Figure 3:
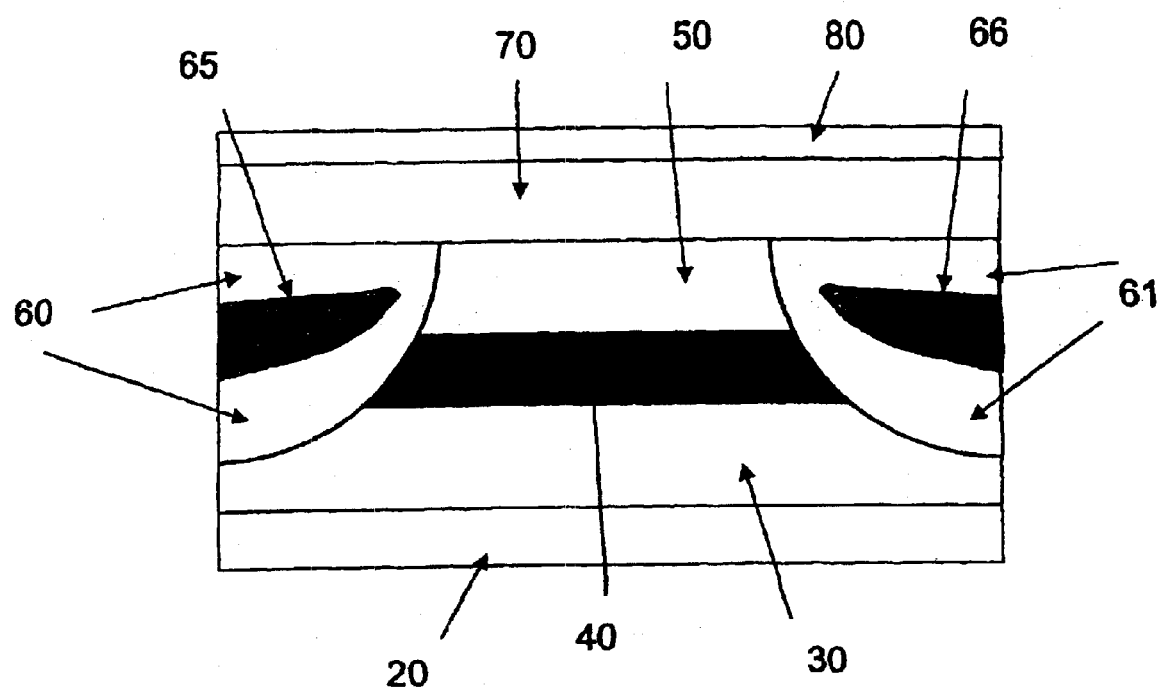
FIG. 3 shows a schematic depiction of the semiconductor structure of FIG. 2 after an infilling process.

Typically the structure 10 will be etched to form a mesa (see FIG. 2) before an overgrowth process is carried out, in which the 'sides' of the mesa are 'filled in' with blocking layers, and further layers are deposited on top of the structure. Referring to FIG. 3, first blocking layers 60, 61 comprise indium phosphide with a p-type dopant that each contains a second blocking layer 65, 66 that comprise indium-phosphide with an n-type dopant. The first blocking layers are formed so as to be in contact with the sides of the first and second cladding layers and the active layer that were exposed through the etching process and are grown to the same height as the second cladding layer. The structure is completed by the addition of a third cladding layer 70, which comprises indium phosphide with a p-type dopant, and a contact layer 80, which comprises indium gallium arsenide (InGaAs) with a p-type dopant.

The inventors believe that when the substrate is heated to growth temperature, phosphorous atoms (or ions) are released from lattice sites in the substrate and diffuse up through the epitaxial structure of the device. When they enter a zinc-doped layer they cause the zinc atoms to be released from lattice sites (although the mechanism by which this happens is not fully understood). If the phosphorus atoms (or ions) enter a MQW active region they can induce intermixing (again, the mechanism for this is not fully understood) and hence cause a shift in the lasing wavelength. Additionally, when the zinc atoms are released from their lattice sites they become mobile and move through the semiconductor structure. If the mobile zinc atoms enter the active region this can also cause a wavelength shift (probably due to bandgap shrinkage). Furthermore, the diffusion of zinc atoms into the first and second cladding layers and the active layer of the structure create further problems, such as poor device performance at high temperatures, increased threshold currents, shifts in the lasing wavelength, decreased device reliability, etc.

Other potential p-type dopants, such as cadmium or beryllium, are not as convenient to use as zinc in semiconductor growth processes, nor are the dopants as effective as zinc within the III–V structures. Furthermore, it is believed that other p-type dopants would diffuse in a similar manner to zinc and thus a change of dopant would not be a solution to the present problem.

There have been a number of proposed solutions to reduce the levels of zinc diffusion, but they have not been particularly effective and have had associated side effects, such as reduced yield and poor device performance. For example, U.S. Pat. No. 5,771,256 discloses the deposition of an AlInGaAs buffer layer between the substrate and the epitaxial structure, which has proved to be difficult to fabricate and only addresses the wavelength shift that is caused by intermixing. Although it is claimed that the AlInGaAs layer prevents wavelength shift due to intermixing there is no indication that it reduces or prevents zinc diffusion.

A further solution is the use of a substrate with a high defect density, but this is not a preferred option as it gives rise to undesirable reliability issues.

Conventionally, the substrate 10 will be supplied as a wafer in a state that is referred to as "epi-ready", that is ready for subsequent epitaxial growth. This means that the surface will have been polished and then cleaned before undergoing a controlled oxidation process such that the substrate can be handled without being contaminated. When the substrate wafer is subsequently processed in order to form semiconductor devices, the initial heating stage causes the oxide layer to desorb so that the materials necessary to form the semiconductor device can be deposited.

Figure 4:
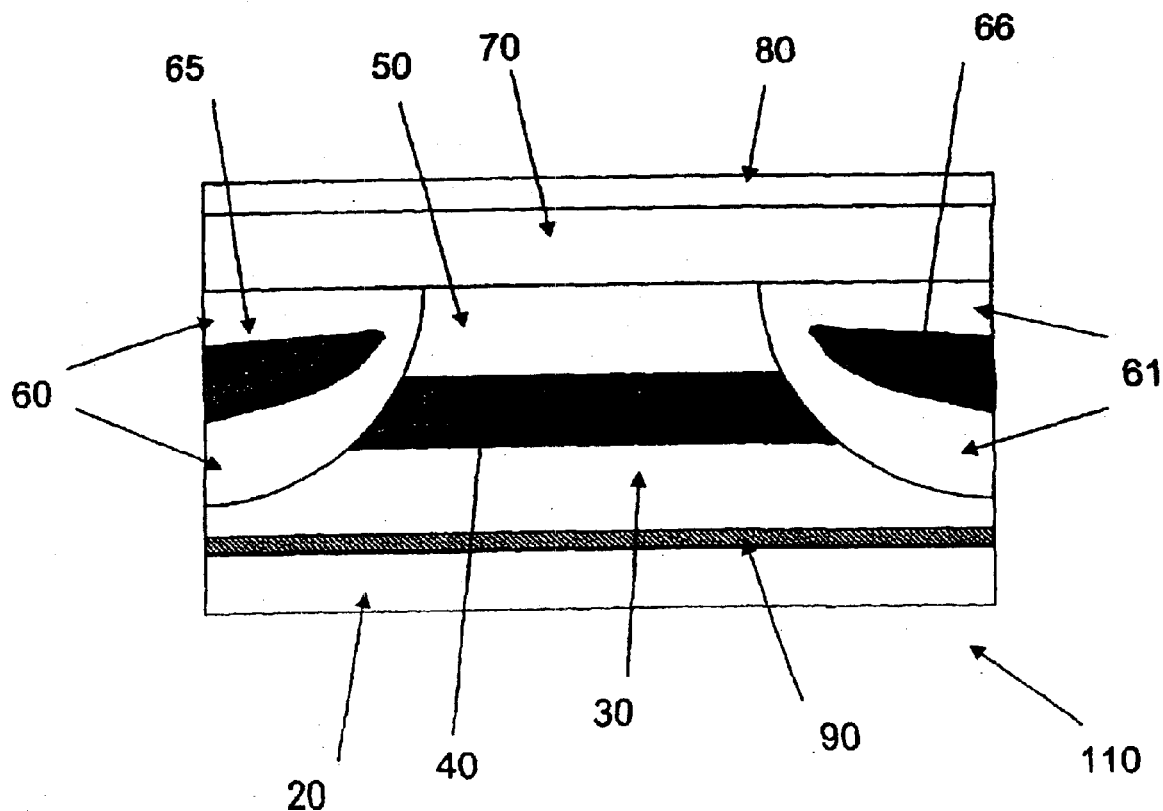
FIG. 4 shows a schematic depiction of a semiconductor structure according to a first embodiment of the present invention.

In the present invention the "epi-ready" substrate is placed in a conventional reactor which is then heated up to standard MOVPE (Metallo Organic Vapour Phase Epitaxy) temperatures and the oxide layer is desorbed. The surface of the substrate is doped using conventional techniques and the substrate is then exposed to an oxidizing agent that forms an oxide layer on the substrate. The presence of the silicon dopant increases the thermal stability of the oxide layer. A dopant that has proved to work successfully, is silicon, the doping of which can be achieved by flowing disilane ($Si_2H_6$) into the reactor at a flow rate of 20 sccm (at a dilution of 50 vpm in argon), for approximately 100 seconds. The substrate wafer is allowed to cool to room temperature and is then briefly exposed to the atmosphere to allow the doped surface to oxidize. The wafer can then be returned to the reactor for a semiconductor structure to be deposited in a conventional manner. Referring to FIG. 4, it can be seen that a semiconductor structure 110 according to the present invention is similar to the structure shown in FIG. 1 but additionally comprises a doped oxide layer 90 that is formed between the substrate 20 and the first cladding layer 30. The structure of FIG. 4 can be etched to form a mesa and then re-grown in a conventional manner.

It is understood that the doping of the oxide layer stabilises the surface oxide layer, preventing the heating effects of the reactor from desorbing all of the oxide layer. It is also believed that the oxide layer acts as a barrier layer and prevents phosphorus from diffusing out of the substrate during the various temperature cycling that occurs during the subsequent growth and etching processes. This barrier effect is thought to reduce subsequent zinc diffusion and quantum well intermixing. Since the oxide layer is very thin, its presence is not detrimental to the subsequent epitaxial growth or the device characteristics.

Figure 6:
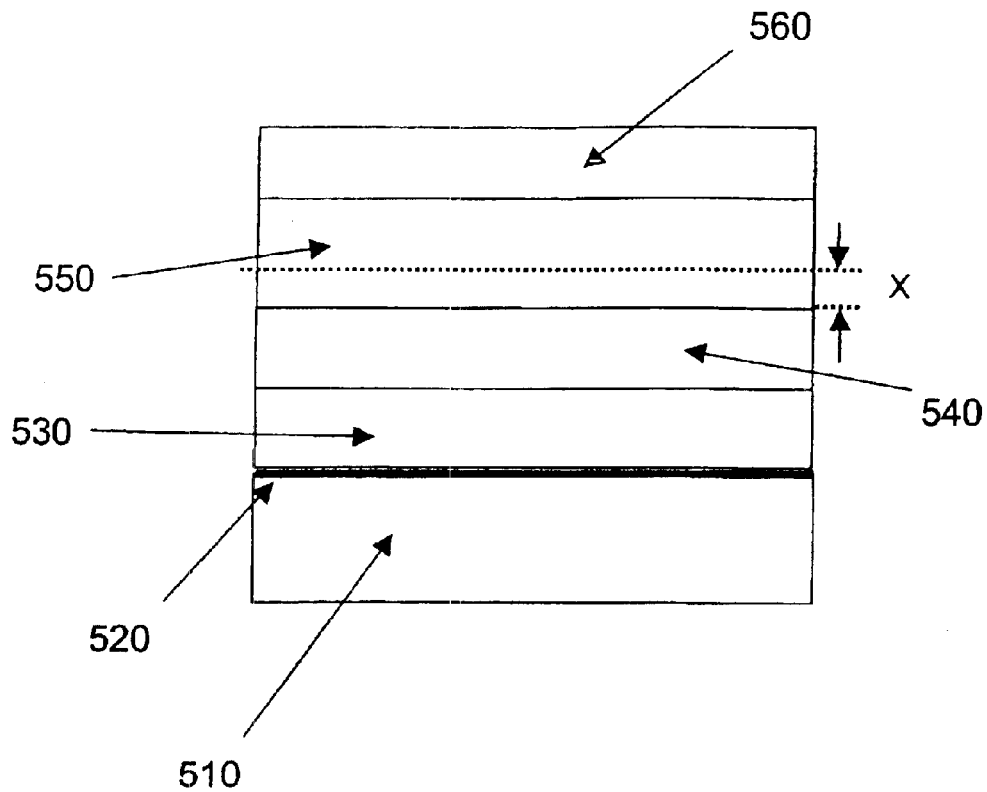
FIG. 6 shows a schematic depiction of a semiconductor structure that was used to determine the efficiency of a method according to the present invention.

FIG. 6 shows an example of a semiconductor structure that was deposited in order to determine the efficiency of the present invention in reducing the diffusion of zinc atoms within the structure. The substrate layer 510 comprises InP with an n-type dopant and the oxide layer 520 deposited on the substrate is silicon-doped in order to increase its stability. A 0.5 μm layer 530 of n-type doped InP (doping density of $4 \times 10^{18}$ cm$^{-3}$) is deposited on the oxide layer, and then a 0.6 μm layer 540 of p-type doped InP (doping density of $1.5 \times 10^{18}$ cm$^{-3}$) is applied. A layer of undoped InP 550 (thickness 0.7 μm) is applied with a 0.5 μm thick capping layer 560 of n-type doped InP (doping density of $5 \times 10^{18}$ cm$^{-3}$) being applied on top of the undoped InP. The structure was annealed under phosphine ($PH_3$) for 90 minutes at a temperature of 625° C. (all layer thicknesses are pre-anneal values). A number of these structures were produced, with a different flowrate of disilane being used to dope the oxide layer of each structure.

Figure 7:
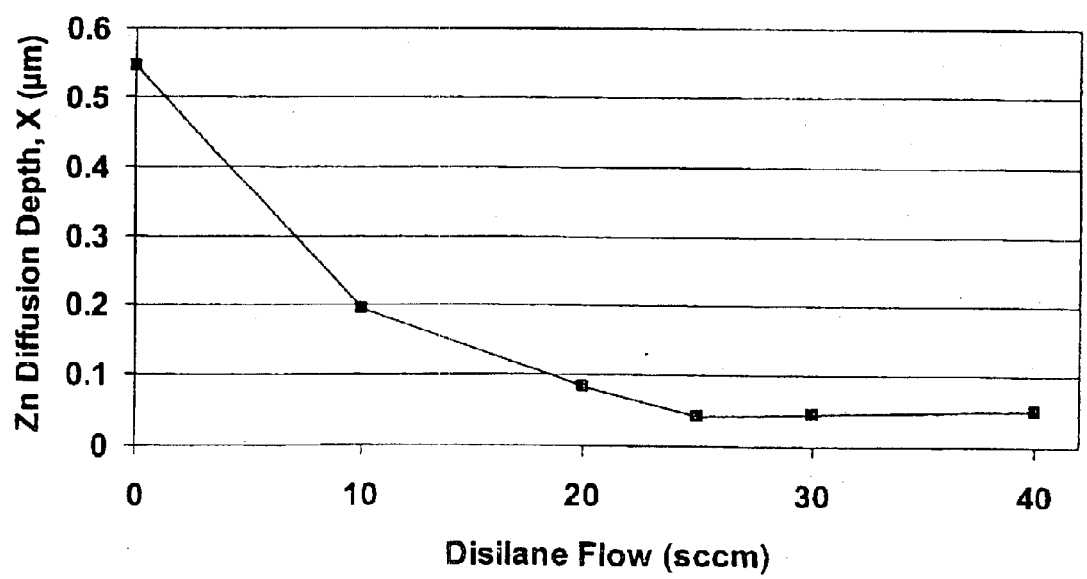
FIG. 7 is a graphical depiction of test results from the structure shown in FIG. 5.

FIG. 7 shows the variation between the diffusion of zinc atoms and the disilane flow rate. The diffusion depth is indicated in FIG. 6 and is the depth into the undoped InP layer 550 that zinc atoms have diffused. FIG. 7 indicates that with no silicon doping the zinc atoms diffuse through almost the entire thickness of the undoped InP layer but that using a flow rate of 20 sccm or higher reduces the zinc diffusion to the first 50 nm of the undoped layer.

A semiconductor structure according to the present invention is described with reference to FIG. 4, purely by way of example and it will be readily apparent that a wide range of further structures can be realized using the present invention. The substrate 20 is n-type indium phosphide with a doping density of approximately $4 \times 10^{18}$ cm$^{-3}$ (a p referred dopant is sulfur) which has a silicon doped oxide layer 90 formed on its upper surface. It is believed that the doped oxide layer has a thickness of approximately 20Å. A first cladding layer 30 of n-type InP with a thickness of approximately 1.5 μm and doping density of approximately $2.5 \times 10^{18}$ cm$^{-3}$ is then grown on the doped oxide layer. The active region 40 comprises an undoped lower confinement layer of InGaAsP which is lattice matched to InP, an undoped InGaAsP strained MQW structure and an undoped upper confinement layer of InGaAsP which is lattice matched to InP. A second cladding layer 50 is then deposited upon the active region, having a thickness of approximately 0.4 µm and a doping density of approximately $1.4 \times 10^{18} \text{cm}^{-3}$.

Figure 5:
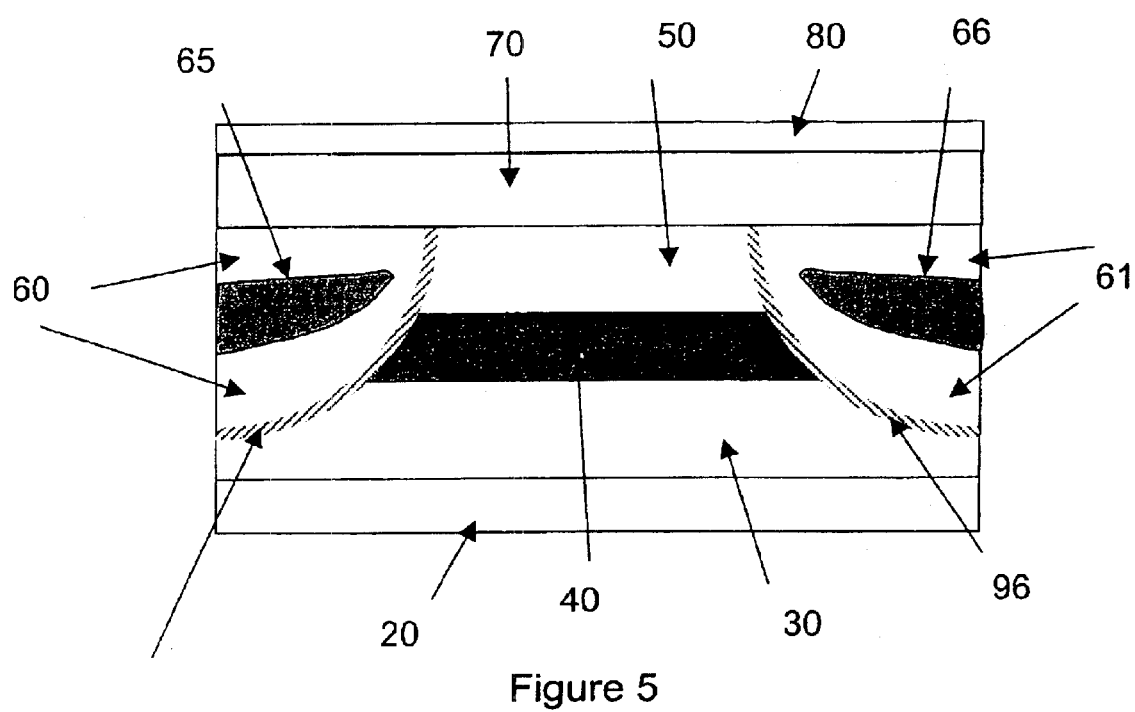
FIG. 5 shows a schematic depiction of a semiconductor structure according to a second embodiment of the present invention.

In a further embodiment of the present invention, which will now be described with reference to FIG. 5, oxide layers 95, 96 can be formed on the mesa sides after the etching step, rather than on the surface of the substrate. These oxide layers can be doped, with silicon for example, before the mesa overgrowth processes. Whilst these doped oxide layers will act as a barrier to reduce zinc diffusion from the subsequently formed blocking layers, they will not be able to reduce phosphorus diffusion from the substrate which is a cause of quantum well intermixing.

Figure 8:
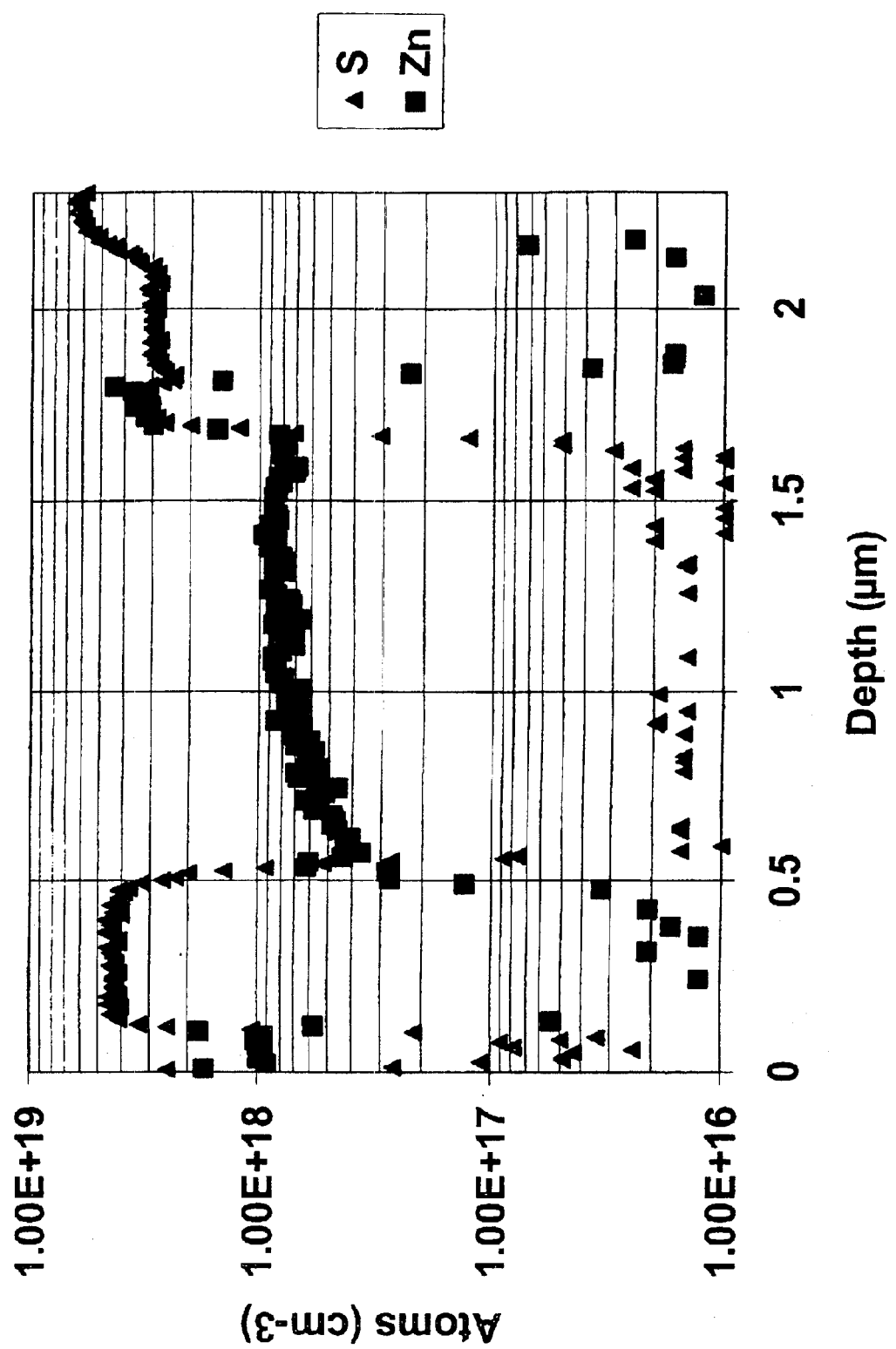
FIG. 8 is a graphical depiction of an analysis of a known semiconductor structure.

FIG. 8 shows a graphical depiction of an analysis of the semiconductor test structure of FIG. 6 without use of the present invention. SIMS (Secondary Ion Mass Spectrometry) has been used to determine the concentration of sulfur and zinc species within the structure. FIG. 8 shows that the sulfur atoms are present in the upper cladding layer 560 and in the lower cladding layer 530 whilst there is an insignificant level of sulfur within the undoped layer. In contrast, the zinc atoms are present in their greatest concentration within the p-type doped layer 540 and the undoped region 550.

Figure 9:
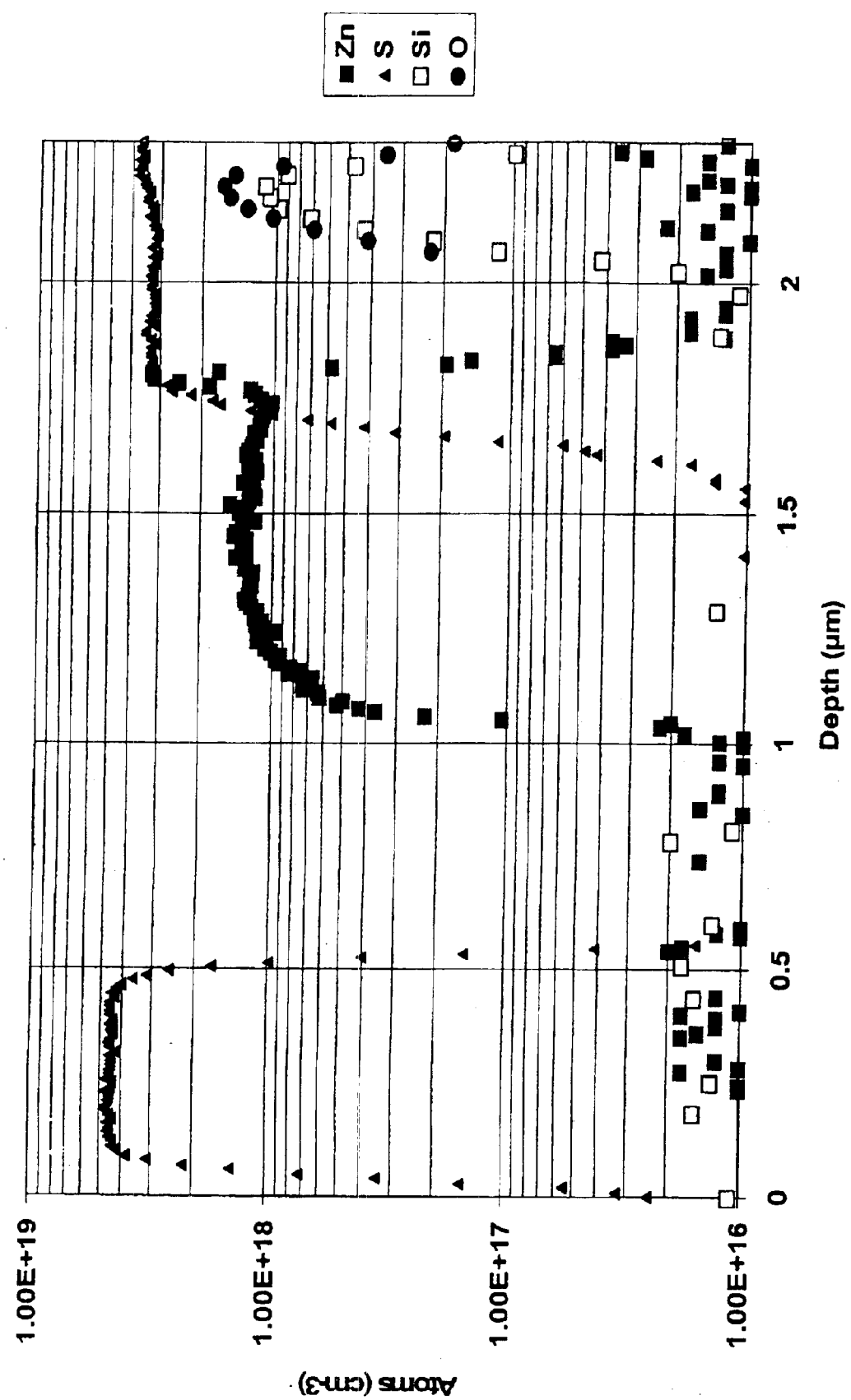
FIG. 9 is a graphical depiction of an analysis of a semiconductor structure according to the present invention.

FIG. 9 shows a similar analysis that has been performed on the semiconductor test structure shown in FIG. 6. The analysis indicates that both silicon and oxygen are found at the interface between the substrate and the lower cladding layer (although the Si and O peaks appear to be overly broad as the oxide layer is believed to be only 20 Å thick. This peak widening is believed to be an artefact of the SIMS analysis). FIG. 9 shows that the extent of zinc diffusion into the undoped region 550 has been reduced by the addition of the silicon-doped oxide layer.

In a third embodiment of the present invention, the doped oxide barriers present in the first two embodiments of the invention are both implemented within a single device.

In a fourth embodiment of the present invention, the silicon-doped oxide could be deposited as a pattern using conventional photolithographic techniques with either an oxide or nitride mask. Once the silicon-doped oxide has been formed, a thin layer of InP can be grown over the silicon-doped oxide to allow the photolithographically defined mask to be stripped using hydrogen fluoride without damaging the doped oxide. This procedure would then allow selective intermixing of MQWs to provide a spatial variation of the MQW wavelength. This could enable the manufacture of a laser with an integral electro-absorption modulator, or of low-loss waveguides within an optoelectronic integrated circuit.

Figure 10:
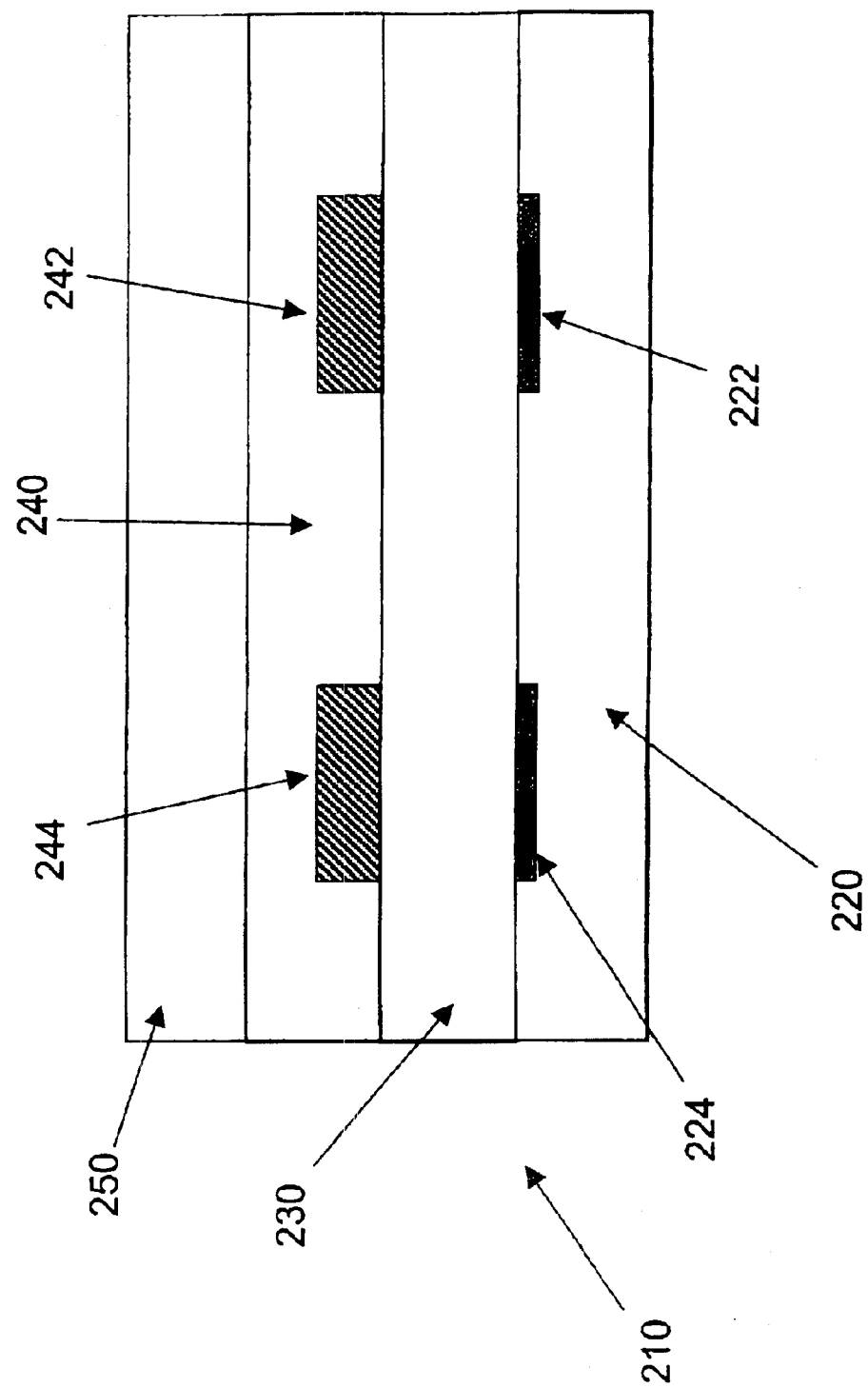
FIG. 10 is a schematic depiction of a further embodiment of the present invention.

FIG. 10 shows a schematic depiction of a further embodiment of the present invention in which only selected areas of an InP substrate are doped and then oxidized. If a MQW structure is deposited above such a substrate and then annealed there will be differing levels of phosphorus diffusion from the substrate. The MQW structure above the undoped substrate regions will experience significant phosphorus diffusion, whilst the MQW structure above the doped substrate region will experience minimal phosphorus diffusion. The differing phosphorus densities in the different MQW areas will give rise to different levels of intermixing and thus different bandgap energy shifts; the greater the phosphorus density the greater the degree of intermixing and hence the greater the bandgap shift. This result can be exploited to form integrated semiconductor devices. In order to form a laser with an integrated electro-absorption modulator (EAM). it is necessary to form active regions having different bandgap energies on the same wafer. An integrated laser-EAM could be formed by not doping the substrate oxide layer where the modulator is to be formed (leading to increased levels of intermixing) and doping the substrate oxide layer in the region where the laser is to be formed. Similarly in order to make an optoelectronic integrated circuit low loss waveguides are required to connect the components. In this case the waveguides can be formed by causing regions on the wafer to become intermixed (by not providing any oxide on the substrate) in order to shift the bandgap energy, and hence the optical absorption edge, to reduce losses.

Referring to FIG. 10, semiconductor structure 210 comprises an indium phosphide substrate 220, first cladding layer 230, multiple quantum well region 240 and second cladding layer 250. Substrate 220 comprises oxidized doped regions 222, 224. Once all of the epitaxial layers have been formed the device is annealed under $PH_3/H_2$, for example at 800° C. for 15 minutes. The annealing process causes phosphorus to diffuse from the substrate. Where the substrate does not comprise an oxidized doped region the phosphorus will migrate into the MQW structure and cause intermixing, causing the formation of areas 242 244 within the MQW region 240 in which there has been a significant bandgap shift. There will be a greatly reduced amount of intermixing in the rest of the MQW region 240, such that any bandgap shift would be much smaller.

A preferred method by which selected areas of a substrate can be doped and then oxidized is to deposit a nitride or oxide mask onto the substrate and then remove the mask from regions where the oxidized doped region is to be formed using standard photolithographic techniques. Disilane can then be flowed over the heated substrate to cause the silicon doping and then the substrate can be oxidized. A layer of InP can then be deposited over the top of the doped oxide layer, for example somewhere between 10–200 nm thick, to protect it when the photolithographic mask is removed. After the mask has been removed, the epitaxial layers are deposited in a conventional manner and then the device is annealed.

In an alternative, the device structure could be fabricated by depositing the dopant stabilised oxide over the entire surface of the substrate and then depositing an InP protective layer. Photolithographic techniques could then be used to selectively etch the indium phosphide and dopant stabilised oxide layers in order to obtain the desired patterning. This method is not preferred as there is a greater uncertainty in etch depth when compared with the method described above, leading to reduced process control and repeatability.

It will be understood that materials other than silicon could be used to stabilise the oxide layer. The inventor has obtained the same effect using iron in place of silicon and it is believed that the invention can be implemented using other commonly used dopants for example tin, zinc, carbon, aluminium, sulfur, etc., and that those who are skilled in the art of semiconductor fabrication technology would readily understand the materials and processes required to use such dopants.

Additionally, it is been demonstrated that it is possible to thermally oxidize the substrate in flowing oxygen, although the beneficial results are lost if the oxide layer is not sufficiently thick and/or stable such that the layer desorbs before growth is commenced. As a further alternative, the substrate could be chemically oxidized using nitric acid, again as long as the oxide layer is not significantly desorbed before layer growth occurs.

In addition to the laser devices described above and similar devices, the present invention is suitable for application with semiconductor lasers having a pnip blocking structure or to other InP-based devices that require minimal zinc diffusion to obtain adequate performance, such as heterojunction bipolar transistors.

Although the preceding discussion has focussed on the use of doping to stabilise an oxide layer that has been deposited on an indium phosphide substrate, the present invention may also be applicable for use with other substrates, such as, for example, gallium arsenide.

What is claimed is:

1. A semiconductor device comprising:
   a substrate of III–V semiconductor material,
   an oxide layer permanently formed on a surface of the substrate, the oxide layer having a significant concentration of a dopant material, and
   a plurality of epitaxial semiconductor layers formed on the oxide layer,
   wherein the oxide layer prevents diffusion from the substrate into the plurality of epitaxial semiconductor layers,
   wherein the III–V semiconductor material is indium phosphide doped with sulfur.

2. A semiconductor device according to claim 1, wherein the oxide layer dopant material is silicon.

3. A semiconductor device according to claim 1, wherein the oxide layer is permanently formed on selected areas of the surface of the substrate.

4. A semiconductor device according to claim 1, wherein the oxide layer is approximately 20 angstroms thick.

5. A semiconductor device according to claim 1, wherein the plurality of epitaxial semiconductor layers includes a first cladding layer, an active region, and a second cladding layer.

6. A semiconductor device according to claim 5, wherein the device is a light emitting device.

7. A semiconductor device according to claim 6, wherein the light-emitting device is a laser.

* * * * *